(12) United States Patent
Kunze et al.

(10) Patent No.: US 7,573,359 B2
(45) Date of Patent: Aug. 11, 2009

(54) REDUCING CROSSTALK IN ELECTRONIC DEVICES HAVING MICROSTRIP LINES COVERED BY A FLEXIBLE INSULATING MATERIAL AND A METALLIC BACKING PLATE

(75) Inventors: Richard K. Kunze, Woodinville, WA (US); Olufemi B. Oluwafemi, Lacey, WA (US); Chung-Chi Huang, Hillsboro, OR (US); Xiaoning Ye, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 96 days.

(21) Appl. No.: 11/729,731

(22) Filed: Mar. 29, 2007

(65) Prior Publication Data

US 2008/0238584 A1   Oct. 2, 2008

(51) Int. Cl.
*H01P 5/02* (2006.01)
(52) U.S. Cl. .................. 333/247; 257/728

(58) Field of Classification Search .......... 333/247, 333/246; 257/728
See application file for complete search history.

(56) References Cited

U.S. PATENT DOCUMENTS

| 6,356,173 B1 * | 3/2002 | Nagata et al. ............ 333/247 |
| 6,528,732 B1 * | 3/2003 | Okubora et al. ........... 174/255 |
| 2005/0088260 A1 * | 4/2005 | Ajioka et al. ............ 333/247 |

\* cited by examiner

*Primary Examiner*—Benny Lee
(74) *Attorney, Agent, or Firm*—Trop, Pruner & Hu, P.C.

(57) ABSTRACT

An electronic device may be formed of a printed circuit board having integrated circuits mounted thereon. A backing plate may compress an insulating layer against a microstrip line formed on one surface of said circuit board opposite to the surface that includes integrated circuits. By compressing said backing plate against said insulating layer, less crosstalk may result from the formation of a microstrip on the bottom surface of the printed circuit board. The backing plate may also be used to secure a cooling device, such as a heat sink, on the opposite side of the circuit board.

8 Claims, 2 Drawing Sheets

REDUCING CROSSTALK IN ELECTRONIC DEVICES HAVING MICROSTRIP LINES COVERED BY A FLEXIBLE INSULATING MATERIAL AND A METALLIC BACKING PLATE

BACKGROUND

This relates generally to electronic devices which include integrated circuits, such as processors mounted on circuit boards.

A circuit board may include a number of integrated circuits coupled by traces. The circuit boards may include integrated circuits mounted on the board, for example, through sockets. The traces may be formed within the board or on the outside of the board.

A stripline is a circuit trace routed on an inside layer of a printed circuit board with two low voltage reference planes. The reference planes may be ground or a supply voltage. Basically, the stripline includes the conductor sandwiched by dielectric between a pair of ground planes. It may be formed by etching circuitry formed on the substrate that has a ground plane and then adding a metallic second substrate.

A microstrip is a circuit trace routed on an outside layer of a printed circuit board. A reference plane that is either ground or the supply voltage is adjacent to the trace.

DETAILED DESCRIPTION OF THE INVENTION

Figure 1:
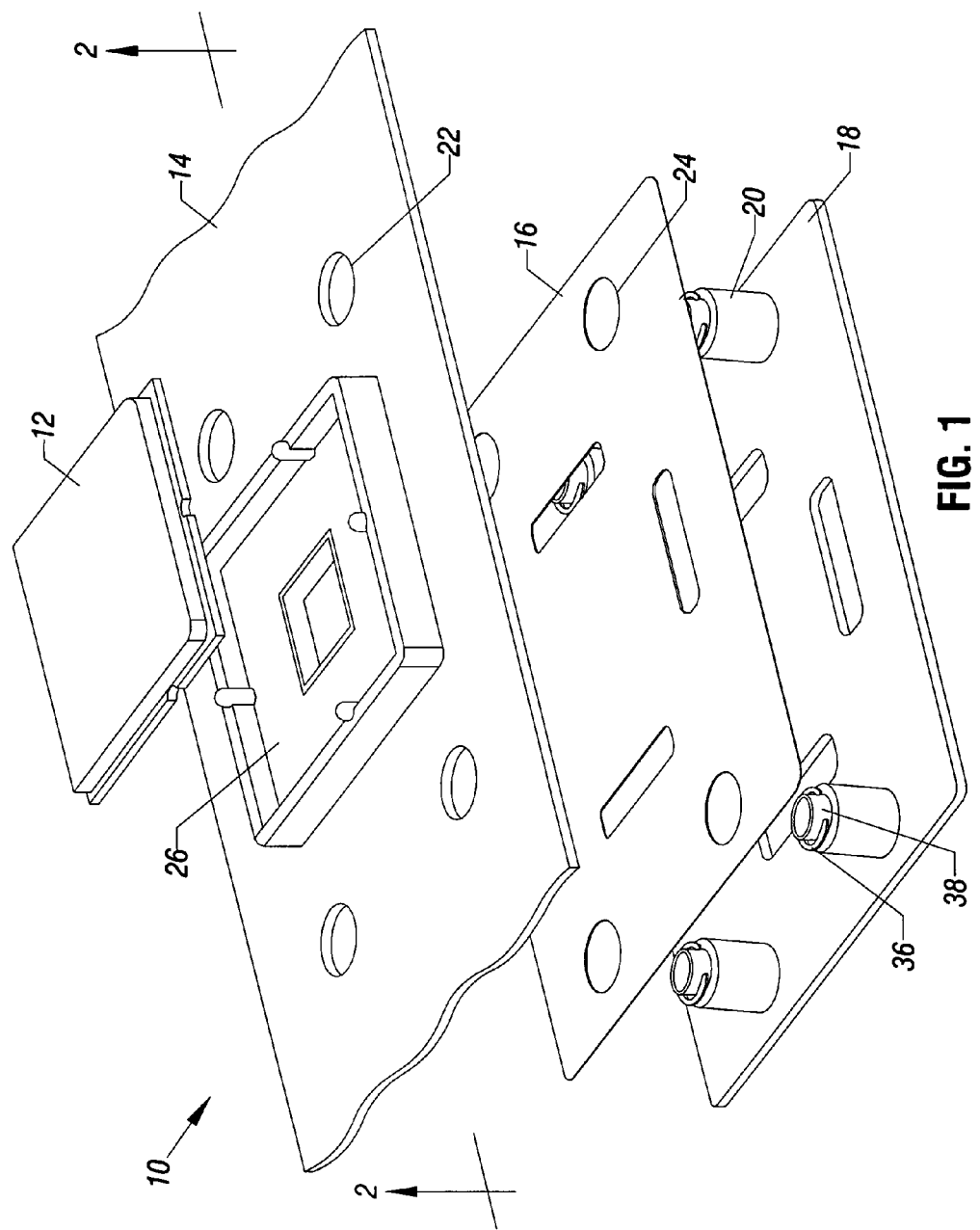
FIG. 1 is a partial, exploded perspective view of one embodiment of the present invention.

Referring to FIG. 1, an assembly 10 may include a printed circuit board 14 that may include a plurality of integrated circuits connected thereto. As depicted, an integrated circuit 12 may be mounted in a board socket 26. The board socket 26 includes connectors to connect, via pins or lands for example, the integrated circuit 12 to circuit traces within the board 14 or thereon. In one embodiment, the integrated circuit 12 may be a central processing unit. The board 14 may include a plurality of holes 22.

Below the printed circuit board 14 may be mounted a separate, additional insulating layer 16 which has holes 24 in the same arrangement and size as the holes 22. The insulating layer 16 may be a Kapton® polyimide layer in one embodiment of the present invention. However, other insulating materials may be used as well. In some embodiments, it may be desirable to use a compressible, resilient insulating layer as the layer 16.

Kapton® polyimide is a flexible, plastic substrate in the imide family that is capable of withstanding temperatures above 285° C. Other useful insulating layers include Mylar plastic film and other polyimide polymer insulators. In addition, urethane material may be utilized as well.

In some cases, the layer 16 may include a set of rectangularly arranged elongate slots. Those slots may enable electrical connections to the socket 26.

Finally, a backing plate 18 may be formed of a metal in one embodiment of the present invention. For example, the plate 18 may be formed of a circuit board material with a metallic coating or by a metal plate. In general, the backing plate 18 may be both rigid and conductive.

In one embodiment, the backing plate 18 includes the number of upstanding posts 20, sized to extend through the openings 24 and 22 and to engage an overlying cooling devices, such as a heat sink (not shown), which may be clamped on top of the integrated circuit 12. In one embodiment, a series of split rings 36 engage a channel formed in a narrower diameter portion 38 of the post 20. A split ring 36 may be inserted into the channel after the posts 20 have already passed through the heat sink.

In this way, the backing plate 18 may apply a compressive force that has two functions. Firstly, it pulls the heat sink down in tight communication with the integrated circuit 12. Secondly, it may compress the layer 16 or otherwise remove air between the layer 16 and the board 14.

Figure 2:
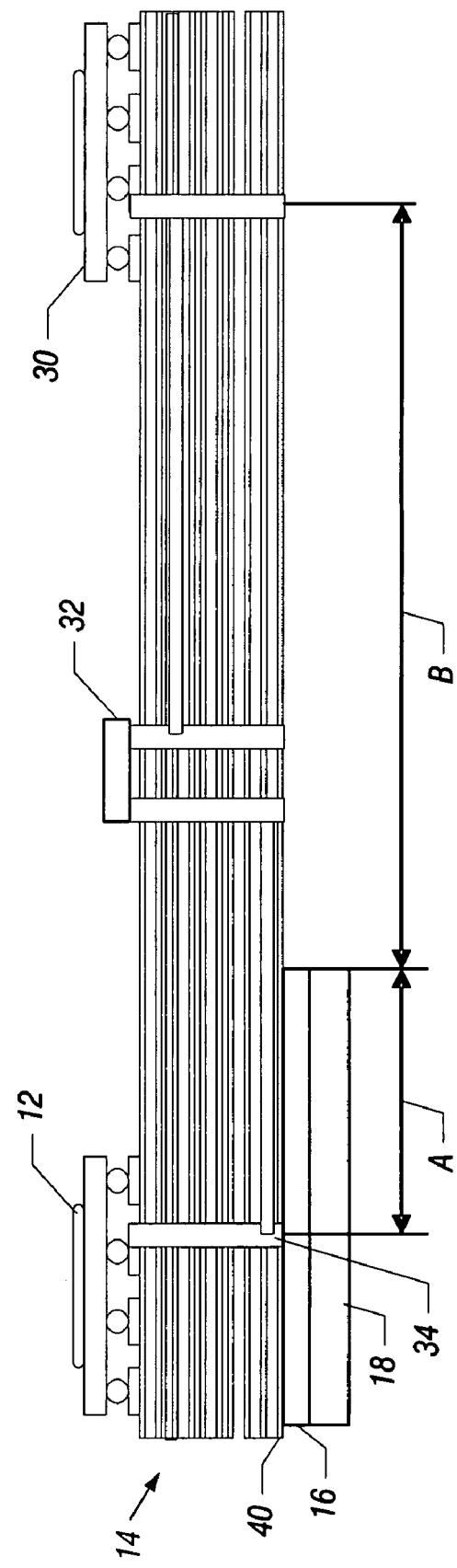
FIG. 2 is a cross-sectional view taken generally along the line 2-2 in FIG. 1.

Referring to FIG. 2, in accordance with one embodiment of the present invention, the board 14 may include a plurality of stacked layers on which are mounted the integrated circuit 12 and another integrated circuit 30. In one embodiment, the board 14 may be a motherboard including a central processing unit implemented by the circuit 12 and an input/output (I/O) hub implemented by the integrated circuit 30. Also mounted on the board 14 may be a mid-bus 32. A via 34 extends transversely through the vertical height of the board 14 and makes contact with a microstrip 40, forming the lower outside layer of the board 14. As shown in FIG. 2, the insulating layer 16 and backing plate 18 are clamped onto the bottom surface of the board 14 and, particularly, onto the microstrip line 40. Thus, the microstrip 40, layer 16, and backing plate 18 may be on the opposite side of the board 14 from the integrated circuits 12 and 30.

Conventionally, microstrip lines on an exterior surface of a circuit board must have their traces more widely spaced because of the crosstalk effects. This may be less so in the case of some embodiments of the present invention because the backing plate 18 provides a second reference plane for the microstrip 40. Specifically, in the region proximate to the high frequency integrated circuit 12, the insulating layer 16 and backing plate 18 may provide the needed second reference plane to reduce crosstalk.

Thus, in some embodiments of the present invention, the insulating layer 16 and backing plate 18 are elongated or extended in the direction of the arrows A. In the region of the arrows B, the microstrip line 40 may not have the extra reference plane. Thus, by elongating the insulating layer 16 and backing plate 18 in the direction of the trace that extends to the integrated circuit 30, crosstalk may be reduced in the vicinity of the high frequency integrated circuit 12.

As a result, in some embodiments, the interpair spacing of the microstrip 40 traces may be reduced because of the reduced crosstalk. At the same time, the backing plate 18 may function to clamp a heat sink onto the integrated circuit 12. Because of a sufficiently compressive force applied to the insulating layer 16 by the backing plate 18, air may be removed between the microstrip 40 and insulating layer 16, which may reduce crosstalk.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An electronic device comprising:
    a circuit board;
    a first integrated circuit mounted on said circuit board, wherein said first integrated circuit is a central processing unit;
    a microstrip mounted on said circuit board on an opposite exterior side of said circuit board from said integrated circuit;
    an insulating layer separate from the circuit board positioned over said microstrip proximate to said integrated circuit, wherein said insulating layer includes a flexible, compressible material; and
    a metallic backing plate over said insulating layer.

2. The device of claim 1, wherein said backing plate includes post to a heat sink on top of said first integrated circuit, said posts adapted to compress the insulating material between said backing plate and said circuit board.

3. The device of claim 2, wherein the insulating material is sufficiently compressed to remove air between the insulating material and the microstrip.

4. A method comprising:
    providing a circuit board;
    mounting a high frequency integrated circuit on a first exterior side of the circuit board;
    providing an insulating layer separate from the circuit board on a second exterior side of the circuit board opposite from the first exterior side of the circuit board, wherein said insulating layer includes a flexible compressible material; and
    securing a backing plate over the insulating layer over a microstrip line formed on the circuit board.

5. The method of claim 4 including using a central processing unit as said high frequency integrated circuit.

6. The method of claim 5 including forming said insulating layer of a flexible, resilient material.

7. The method of claim 5 including compressing said insulating layer between said circuit board and said backing plate.

8. The method of claim 7, including sufficiently compressing said insulating layer to remove air between the insulating layer and the microstrip line.

* * * * *